United States Patent

Suverkropp

[15] 3,687,172

[45] Aug. 29, 1972

[54] LEAD STRAIGHTENER AND METHOD

[72] Inventor: Claus P. J. Suverkropp, Sunnyvale, Calif.

[73] Assignee: Signetics Corporation, Sunnyvale, Calif.

[22] Filed: Oct. 7, 1970

[21] Appl. No.: 78,647

[52] U.S. Cl. ....................140/147, 53/21 R, 53/113

[51] Int. Cl. ....................B21f 1/02

[58] Field of Search....................140/1, 147

[56] References Cited

UNITED STATES PATENTS

| | | | |
|---|---|---|---|
| 3,515,175 | 6/1970 | Hudson | 140/1 |
| 3,525,372 | 8/1970 | Haven | 140/147 |

*Primary Examiner*—Travis S. McGehee

*Attorney*—Flehr, Hohbach, Test, Albritton & Herbert

[57] ABSTRACT

A lead alignment apparatus and method for aligning leads of an integrated circuit package. A magazine feed automatically feeds circuit packages into a track. Circuit packages on the track are moved one by one along the track by a walking beam. At an alignment station the leads of the circuit package engage one comb which bends the leads in one direction so they are in alignment with each other. Subsequently the leads are inserted into a second comb which maintains their alignment with respect to each other and bends the leads so that they are generally perpendicular to the length of the circuit package. At a restrike station the circuit package leads are bent so that they all depend from the circuit package at the same predetermined angle with respect to the width of the circuit package. The circuit packages with the aligned leads are then automatically fed into shipping tubes.

13 Claims, 26 Drawing Figures

LEAD STRAIGHTENER AND METHOD

BACKGROUND OF THE INVENTION

This invention pertains to a lead alignment apparatus and method for aligning leads of an integrated circuit package.

In the manufacture of integrated circuits the end product is generally an encapsulated circuit package with a plurality of spaced leads extending therefrom. One of the most common end configurations is what is referred to in the trade as an "A" pack or a "dual-in-line" pack. In this configuration spaced leads extend on either side of a circuit package and are bent downwards. Such a configuration is very useful and convenient in connecting the circuit packages into their operating environment. For example, recently there has been developed automatic insertion equipment for inserting and connecting integrated circuit packages into larger circuits. For example, a printed board may have a plurality of apertures adapted to receive the spaced leads of an integrated circuit package with a solder fountain or other soldering operation for simultaneously connecting all the leads of the integrated circuit board. Alternatively, the leads of an integrated circuit package may be inserted into connectors which are designed to mechanically receive the circuit package leads and retain the circuit package while making electrical contact to the leads of the circuit package. Therefore, it is obvious that it is desirable to have the leads of a finished integrated circuit package aligned with respect to each other and to the body of the circuit package so that the circuit package may be connected to larger circuits through the use of automatic insertion equipment.

Previously, the leads of a finished integrated circuit package have been aligned and straightened by manual operations. For example, an operator visually inspects the finished package and manually aligns the leads to a predetermined configuration. When, however, large quantities of integrated circuits are produced, it becomes very expensive and time consuming to have the leads of the finished circuit package thus manually aligned. What is needed, therefore, is automatic equipment in which circuit packages may be batch processed for straightening and bending their leads to predetermined configurations.

SUMMARY OF THE INVENTION

Accordingly, it is an object of this invention, to provide an improved method and apparatus for aligning the leads of an integrated circuit package.

It is another object of this invention to provide an automatic lead alignment apparatus and method which includes magazine feed means for automatically feeding a plurality of circuit packages from a magazine to the lead alignment apparatus and automatic tube loading apparatus for automatically loading circuit packages from the lead alignment apparatus into shipping tubes.

Briefly, according to one embodiment of the invention, means are provided for bending leads of a circuit package in one direction to adjust the pitch of the leads so that they are all generally in alignment with each other. The leads are then bent in an opposite direction to the one direction to generally align them perpendicularly with respect to the circuit package. The leads are further bent in a third direction perpendicular to the first and second direction so that the leads depend downwardly at a uniform angle from the circuit package.

DESCRIPTION OF THE PREFERRED EMBODIMENT

Magazine Feed

Figure 1:
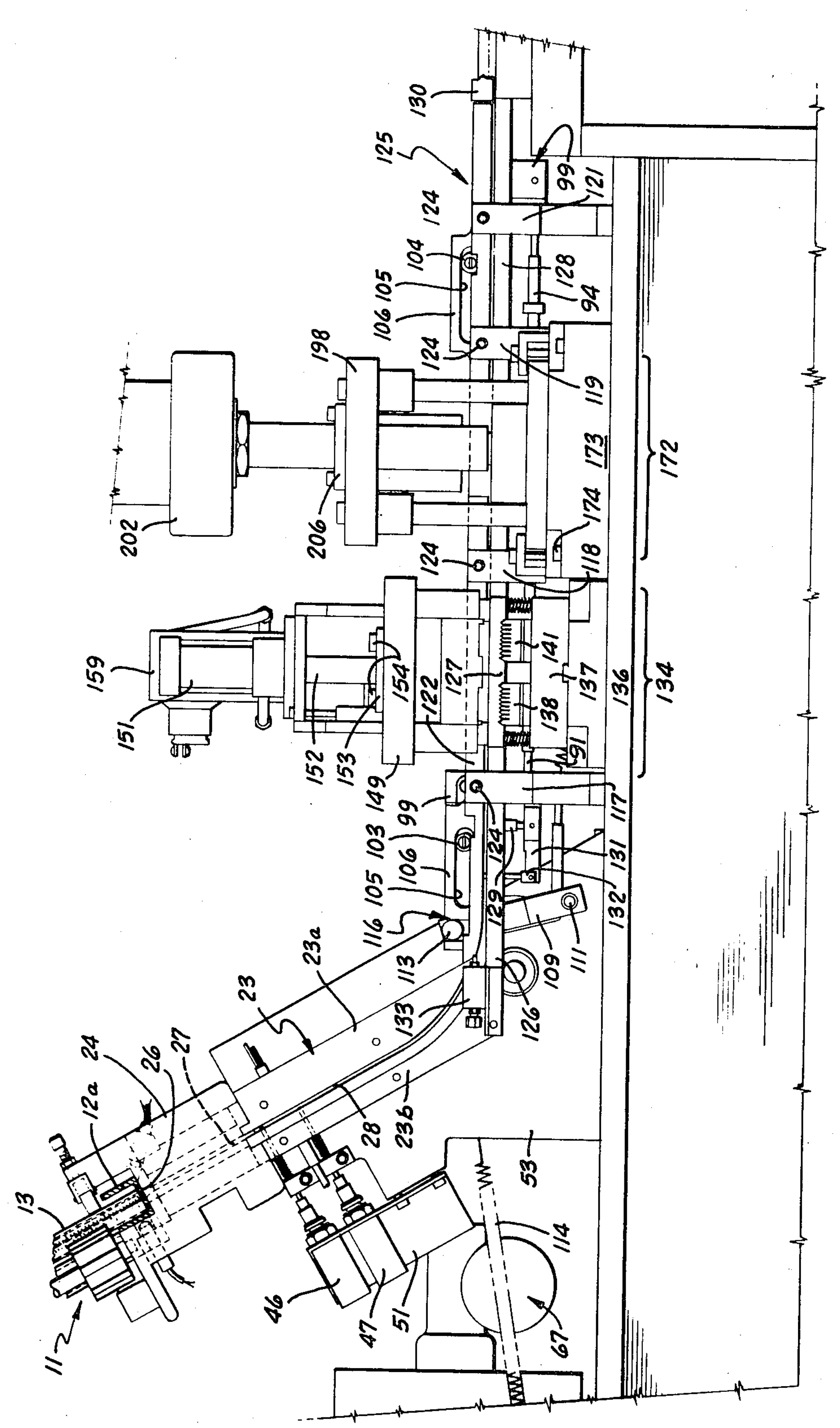
FIG. 1 is a side elevation of a lead alignment apparatus.

Referring now to the figures, the lead alignment apparatus includes a magazine feed apparatus 11. The magazine feed apparatus 11 includes a magazine frame 12 having a lower member 12*a*. The magazine frame 12 is adapted to support a magazine 13 which as may particularly be seen in FIG. 4 has convoluted sides 13*a* and 13*b* which cooperate to form a plurality of open-ended tubes generally indicated by reference numeral 14. The tubes 14 are each adapted to receive a plurality of integrated circuit packages 16 and retain them in end-to-end relationship. The magazine feed apparatus includes a motor 17 mounted to the magazine frame 12 and having a shaft 18 to which spaced gears 19 and 21 are integrally secured such as by keys 22. Means are provided forming a curved track 23 having an input end member 24. The input end member 24 has spaced arm portions 24*a* and 24*b* which define a recess for receiving the lower member 12*a* of the magazine frame 12. The lower member 12*a* of the magazine frame 12 contains a guide opening 26 having the same general cross sectional shape as the tubes 14. The guide opening 26 is in alignment with a circuit package passage way 27 in the input end member 24. The curved track 23 comprises an upper track member 23*a* and a lower track member 23*b* which cooperate to define a track slot 28 therebetween. The track slot 28 has a generally rectangular configuration for permitting circuit packages to slide down the track slot 28 with their leads extending between the upper and lower track members 23a and 23*b*. The spaced arm portion 24*a* of the input end member 24 mounts a roller assembly 29 as particularly shown in FIG. 3. The roller assembly 29 includes a roller arm 31 mounted to the spaced arm portion 24*a* by suitable means such as shaft 32. A spring loaded roller 33 is mounted to the spaced arm portion 31 and is adapted for rolling engagement with convolutions of the magazine 13. The spaced arm portion 24*b* of the input end member 24 has a switch mount 34 which mounts a roller switch assembly 36. The roller switch assembly includes a switch 37 adapted for engagement with the gear 21. The input end member 24 has openings 38 and 39 formed therein in which detecting means are disposed. Specifically, the detecting means comprises a light source 41 disposed in the opening 39 and a photoelectric detector 42 disposed in the opening 48. The lower member 12*a* of the magazine frame 12 has an opening 43 which communicates with the opening 39 in which the light source 41 is disposed and which is situated adjacent the guide opening 26 in the lower member 12*a*. Similarly, the lower member 12*a* has an opening 44 which communicates with the opening 38 in which the photoelectric detector 42 is disposed and which is disposed opposite the opening 43 adjacent the guide opening 26.

In operation, the plurality of tubes 14 in the magazine 13 are filled with integrated circuit packages 16 disposed in end-to-end relationship. The magazine 13 is manually positioned on the frame 12 so that one of the tubes 14, for example, the first tube of the magazine, is in alignment with the guide opening 26 in the lower member 12*a* of the frame 12. In this position the gear 21 and the gear 19 engage the convolutions of the convoluted side 13*b* of the magazine 13. The spring loaded roller 33 in a similar fashion engages the convolutions of the convoluted side 13*a* of the magazine 13 and serves as a locating means for the same. The switch roller 37 engages the gear 21 and rotation of the gear 21 actuates the switch assembly 36 which indicates that the magazine 13 is being indexed. The integrated circuit packages 16 are gravity fed down the one of the tubes 14 which is in alignment with the guide opening 26 in lower member 12*a*. After all of the integrated circuit packages 16 in the one tube 14 in alignment with guide opening 26 have been fed from the one tube 14 it is necessary to index the magazine 13 so as to position the next of the tubes 14 in alignment with the guide opening 26. In accordance with one embodiment of the invention the magazine 13 is constructed of a translucent plastic. The detecting means comprising light source 41 and photoelectric detector 42 are positioned so as to sense the presence or absence of integrated circuit packages 16 in the one of the tubes 14 in alignment with the guide opening 26. That is, if there are no circuit packages 16 in the one of the tubes 14 in alignment with the guide opening 26 the light source 41 is not obstructed and illuminates through the convoluted side 13*b* of the magazine 13 the convoluted side 13*a* thereof so that the convoluted side 13a is illuminated with a diffused light. The photoelectric detector 42 senses the presence of this diffused light on the convoluted side 13*a* and generates a control signal in response thereto. Thus, as long as there are circuit packages 16 in the one of the tubes 14 of the magazine 13 in alignment with the guide opening 26, the light from light source 41 will not illuminate that portion of the convoluted side 13*a* and the photoelectric detector 42 will not be actuated. When, however, there are no circuit packages 16 remaining in the one of the tubes 14 in alignment with guide opening 26 the photoelectric detector 42 senses the diffused light on the convoluted side 13*a* of the magazine and generate a control signal. The control signal generated by the photoelectric detector 42 is adapted to actuate the motor 17 for indexing the magazines 13 so as to position the next of the tubes 14 in alignment with the guide opening 26 in the lower member 12*a*. Specifically, the motor 17 rotates the shaft 18 so that the spaced gears 19 and 21 rotate and translate the magazine 13 until the switch roller 37 is again contacted by the gear 21 which then de-activates the motor 17. When the switch roller 37 is again encountered by the gear 21 the magazine 13 has been translated by the gear 21 so that the next of the tubes 14 is in alignment with the guide opening 26 in the lower member 12*a*. The spring loaded roller 33 simply serves as an additional guide means which fits between convolutions on the convoluted side 13*a* of magazine 13 so as to insure precise positioning of the magazine 13 with respect to the guide opening 26. After the next of the tubes 14 has been emptied of circuit packages 16 the photoelectric detector 42 is again actuated to turn on the motor 17 for indexing the magazine 13 by means of the gears 19 and 21. This alternate emptying and indexing of the magazine tubes 14 continues until all of the circuit packages 16 have been gravity fed from all of the tubes 14.

TRACK ESCAPEMENT

Figures 3, 4:
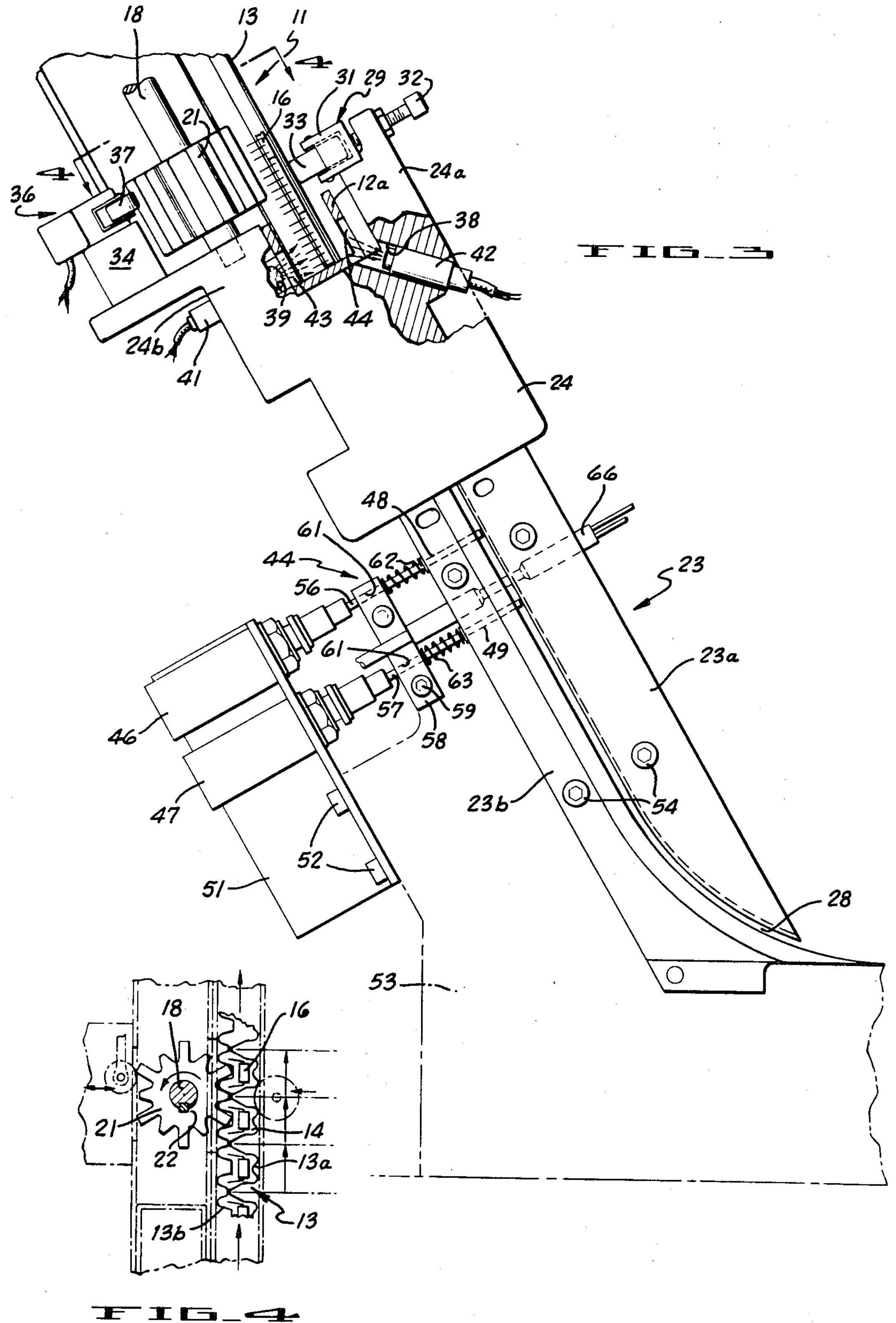
FIG. 3 is an enlarged side elevation partly in cross section of the input end portion of the alignment apparatus of FIG. 1.
FIG. 4 is a cross section view of the magazine feed apparatus taken along the line 4—4 in FIG. 3.
Figures 5, 6:
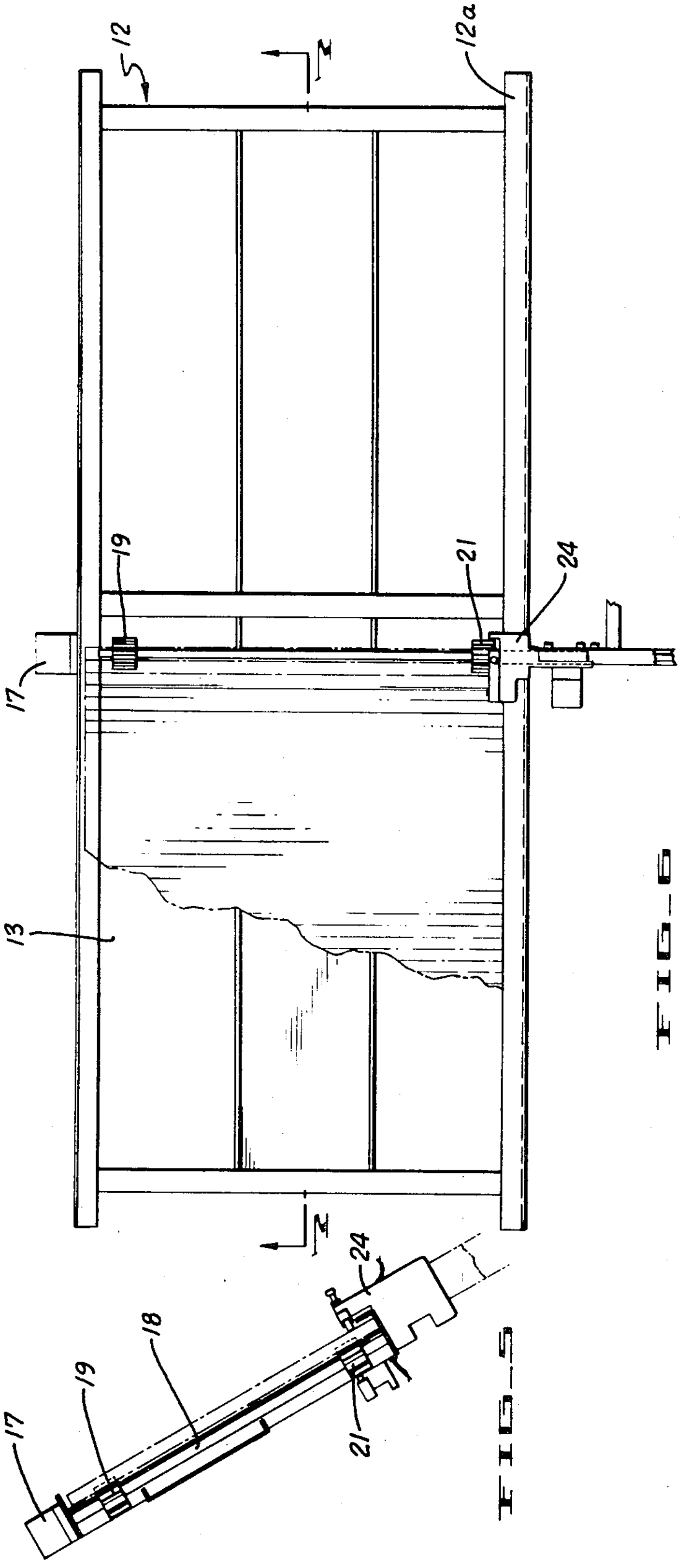
FIG. 5 is an end view of the magazine feed apparatus.
FIG. 6 is a front elevation of the magazine feed apparatus.
Figure 7:
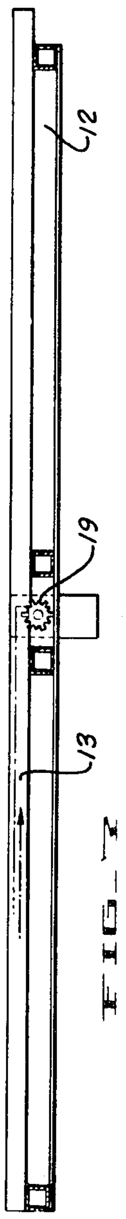
FIG. 7 is a cross sectional view of the magazine feed apparatus taken along the line 7—7 in FIG. 6.

Referring now particularly to FIG. 3, the curved tract 23 has an escapement 44 adjacent the input end member 24. The escapement 44 includes two electric solenoids 46 and 47. The lower track member 23*b* has two openings 48 and 49 formed therein. The electric solenoids 46 and 47 are mounted, as shown, in the solenoid bracket 51 which is suitably secured such as by screws 52 to a base member 53. The upper and lower track members 23a and 23*b* are also suitably secured such as by screws 54 to the base member 53. The electric solenoids 46 and 47 have operating pins 56 and 57, respectively. A pin bracket is suitably secured such as by screws 59 to the base 53 and has openings 61 which slidably guide the operating pins 56 and 57. The operating pins 56 and 57 extend through the opening 61 in the pin bracket 58 through the openings 48 and 49 in the lower track member 23*b* and are adapted to obstruct the track slot 28. Springs 62 and 63 respectively surround the portion of the operating pin 56 and 57 between the pin bracket 58 and the lower track member 23*b* and serve as spring biasing for maintaining the operating pins 56 and 57 in a position such that they both extend into the track slots 28 when the electric solenoids 46 and 47 are not operated. The lower track member 23*b* mounts a light source 64 and the upper track member 23*a* mounts a photoelectric detector 66. The light source 64 and photoelectric detector 66 are aligned with each other such that the light source 64 illuminates the photoelectric detector 66 across the track slot 28 when there are no circuit packages disposed in the track slot 28 between the operating pins 56 and 57. When, however, there is a circuit package in the track slot 28 between the operating pins 56 and 57 this circuit package obscures the light source 64 from the photoelectric detector 66.

In operation, the escapement 44 serves to allow one circuit package at a time to slide down the track slot 28 where it can be picked up by a transport means, discussed in more detail hereinafter. The electric solenoids 46 and 47 are controlled by the transport means to allow a circuit package to slide down the curved track 23 when the transport means is ready to receive a circuit package. Thus, initially neither of the electric solenoids 46 and 47 are operated so that circuit packages are gravity fed down the circuit package passageway 27 of the input end member 24 until the lowermost circuit package abuts against the operating pin 56 extending into the track slot 28. Next, the electric solenoid 46 is operated to withdraw the operating pin 56 against the biasing force of the spring 62 so as to allow a circuit package to slide down the track slot 28 past the pin 56. This circuit package then abuts the operating pin 57 extending into the track slot 28 and is prevented from further downward travel. The electric solenoid 46 is then deactuated so that its operating pin 56 is forced by the spring biasing force of the spring 62 to extend back into the track slot 28 between the circuit package which has just slid past the operating pin 56 and the next upper adjacent circuit package in the track slot 28. Then when the transport means is ready to receive a circuit package it operates the electric solenoid 46 so that the operating pin 57 is withdrawn against the spring biasing force of the spring 63 from the track slot 28 so that the circuit package retained between the operating pins 56 and 57 is allowed to slide down the track slot 28 under the influence of gravity where it can be picked up by the transport means.

The light source 64 and photoelectric detector 66 serve as an additional detecting means for detecting when the one of the tubes 14 of magazine 13 which is in alignment with the guide opening and the circuit package passageway 27 of the input end member 24 has been emptied of all of the circuit packages retained therein. Thus, when the electric solenoid has been operated, say twice for example, and the light source 64 has not been obscured by a circuit package from the photoelectric detector 66, this can serve as an indication that there are no circuit packages coming down the circuit package passageway of the input and member 24 which means that the one of the tubes 14 in alignment with the guide opening 26 and circuit package passageway 27 is emptied of circuit packages. Alternatively, the photoelectric detector 66 can serve as a counting mechanism for counting the number of circuit packages passed by the escapement 44.

WALKING BEAM TRANSPORT

Figure 2:
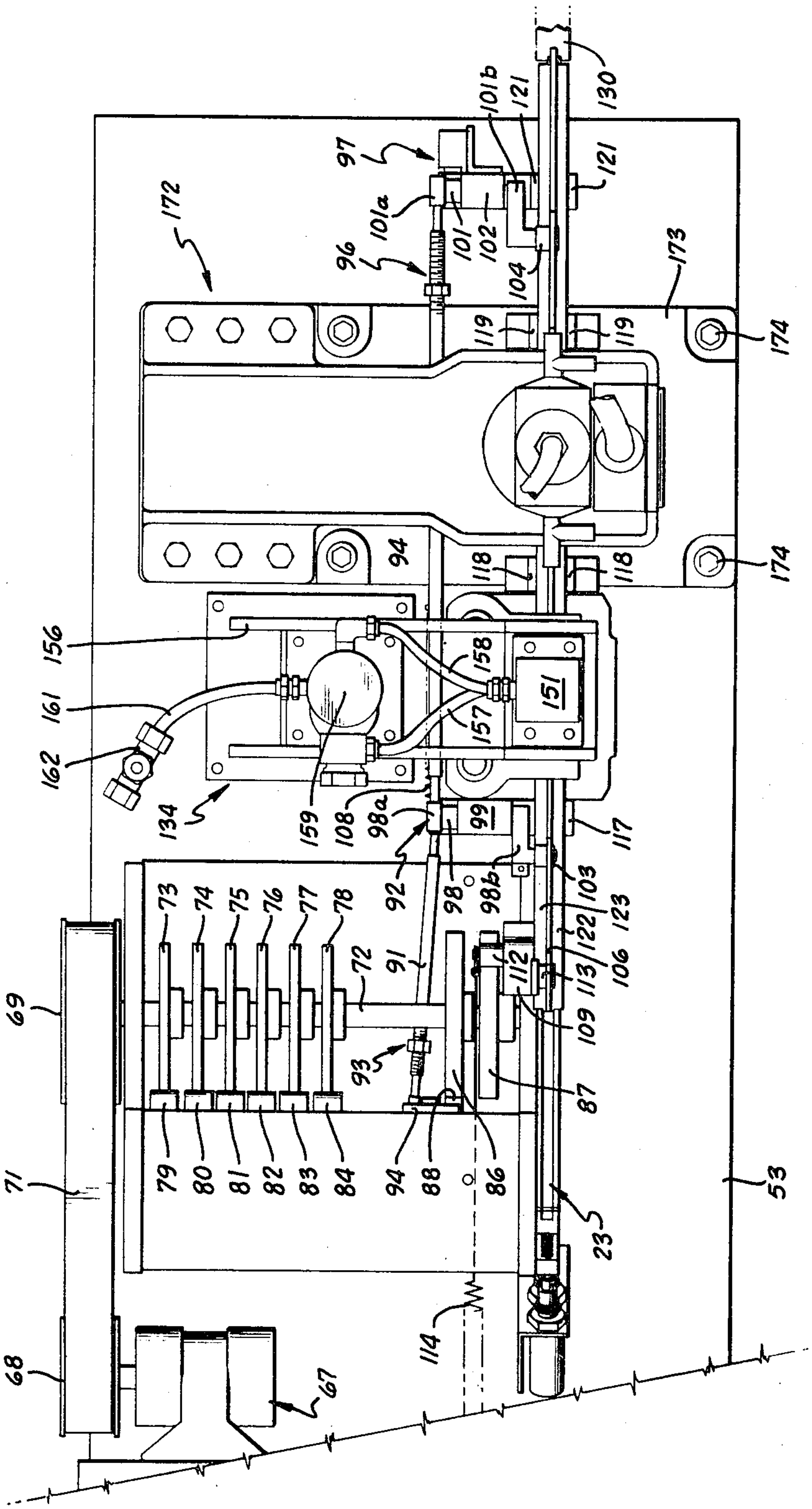
FIG. 2 is a top of plan view of a portion of the apparatus of FIG. 1.

Referring now particular to the FIGS. 1 and 2, a motor 67 is mounted on the base 53 and drives a pully 68. The pully 68 is connected to a pully 69 by a belt 71. The pully 69 drives a camshaft 72 which has a series of switching cams 73 through 78 for actuating respectively a series of switch assemblies 79 through 84. The camshaft 72 also has a vertical transport cam 86 drives a cam roller 88 which is mounted to a pivoted control arm 89. One end of a control link 91 is pivotly mounted to the pivoted control arm 89. The other end of the control link 91 is mounted to a bellcrank assembly 92 and the control link 91 may have adjustable stop means 93 as shown in FIG. 2. Mounted to the bellcrank assembly 92 is one end of another control link 94 which include adjustable stop means 96 and whose other end is mounted in another bellcrank assembly 97. The bellcrank assembly 92 includes a bellcrank 98 which is journaled in a bellcrank bracket 99. The bellcrank 98 has an arm 98*a* to which the control links 91 and 94 are pivotly mounted and also has an arm 98*b*, with the arms 98*a* and 98*b* being generally perpendicular to each other. Similarly, the bellcrank assembly 97 comprises a bellcrank 101 journaled in a bellcrank bracket 102. The bellcrank 101 has an arm 101*a* to which the control link 96 is pivotly connected and has an arm 101*b* which extends generally perpendicular to the arm 101*a*. The bellcrank arm 98*b* mounts a roller 103 and the bellcrank arm 101*b* mounts a similar roller 104. The roller 103 rides inside a horizontally elongated slot 105 of a walking beam 106 and the roller 104 rides inside a horizontally elongated slot 107 in the same walking beam 106. A spring 108 is connected between the bellcrank arm 98*a* and a portion of the base 53 to normally hold the bellcrank assembly 92, and hence the bellcrank assembly 97 due to its coupling through control link 94, in the position shown in FIG. 2.

A roller arm 109 is pivotly mounted to the base 53 by means such as pivot 111 and has rollers 112 and 113 disposed on opposite sides thereof. A spring 114 is connected between the roller arm 109 and a portion of the base 53 to bias the roller arm 109 such that the roller 112 carried thereby is forced into engagement with the horizontal transport cam 87 and follows the contours thereof. The roller 113 is retained in a vertically elongated slot 116 of the walking beam 106.

Spaced tract supports 117, 118, 119 and 121 extend upwardly from the base 53 and support upper guide rails 122 and 123 which are affixed to the spaced track supports by suitable means such as screws 124. Support means in the form of a lower track section 126, a spring bar 127 generally continuous with the lower tract section 126, a lower die track section 176 generally continuous with the spring bar 127 and a lower track section 128 generally continuous with the lower die track section 176 are provided for supporting circuit packages along their respective lengths. The walking beam 106 is mounted between the upper guide rails 122 and 123 for sliding movement therebetween and is supported at either end by the rollers 103 and 104. The walking beam 106 has a plurality of shoulder portions 106a therein which define recesses 106*b* adapted to engage a circuit package supported by the lower track sections 126 and 128, the spring bar 127 and the lower die track section 176. (This is particularly shown in FIG. 9).

An operating link 129 is pivotly mounted to the arm 98b of the bellcrank 98 and extends downwardly where it is pivotly mounted to another operating arm 131. A stop pin 132 is pivotly mounted to the operating arm 131 and extends upwardly through an aperture in the lower track section 126 and is adapted to selectively block the track slot 28. An airblast assembly 133 is mounted to the lower track section 126 where it meets the lower track member 23*b*.

In operation, circuit packages are gravity fed down through the track slot 28 past the escapement 44 where the airblast assembly 133 blasts them with air to cause them to move to the right along the track slot 28 until the circuit package encounters the first of the shoulder portions 106a of the walking beam 106. The vertical transport cam 86 is contoured such that as it rotates the pivoted control arm 89 is pivoted so that the control link 91 is displaced to the left in FIGS. 1 and 2. As the control link 91 is displaced to the left, the bellcrank 98 which is attached through its arm 98*a* to the control link 91 is rotated such that its arm 98*b* is moved from a horizontal to a angular position. The movement of the bellcrank arm 98*a* also carries with it the control link 94 which rotates the bellcrank arm 101*a* from a horizontal to a angular position. Rotation of the bellcrank arms 98*b* and 101*b* causes the rollers 103 and 104 to be moved upwards which carries the walking beam 106 upwards by supporting it in the horizontally elongated slots 105 and 107. At this point the walking beam 106 is prevented from moving horizontally by being retained in a fixed horizontal position by the roller 113 disposed in the vertically elongated slot 116. As the walking beam 106 moves vertically upwards the stop pin 132 which is mechanically connected by the operating link 131 and the operating arm 129 to the bellcrank arm 98b, is moved upwards to block the track slot 28 so that no circuit packages can get past the stop pin 132 while the walking beam 106 is in an elevated position. After the walking beam 106 has moved upwards to an elevated position, it is moved to the left in FIG. 1 by the horizontal transport cam 86 acting on the roller 112 which is connected to the pivoted roller arm 109. That is, as the roller arm 109 pivots in a counter clockwise fashion about the pivot 111 due to the roller 112 following the contours of the horizontal transport cam 86, the roller 113 is moved to the left and carries with it the walking beam 106 due to the roller 113 being retained in the vertically elongated slot 116. After the walking beam 106 has been moved to the left it is moved downwards due to the vertical transport cam 87 operating through the cam roller 88 and the pivoted control arm 89 to force the control link 91 to the right, which rotates the bellcrank 98 and hence, through the control link 94, the bellcrank 101. Rotation of the bellcranks 98 and 101 cause their respective arms 98*b* and 101*b* to be rotated from a vertical to a angular position, which rotation is transformed through the rollers 103 and 104 retained in the horizontally elongated slots 105 and 107 of the walking beam 106 into a downward movement of the walking beam 106. As the walking beam 106 moves downward the recesses 106*b* formed by the shoulders 106a in the walking beam 106 engage circuit packages retained on the lower track section 126. Next rotation of the horizontal transport cam 86 acting through the cam roller 112 on the pivoted lower arm 109 causes the roller 113 and hence the walking beam 106 to be advanced to the right by a generally clockwise rotation of the roller arm 109 above the pivot 111. In this manner the walking beam 106 is moved to the right, then upwards, then to the left and then downward by the consecutive actions of the cams 86 and 87 whereby the recesses 106*b* formed by the shoulder portion 106*a* in the walking beam 106 engage circuit packages retained on the lower track section 126, the spring bar 127, the lower die track section 176 and the lower track section 128 and move the circuit packages to the right. As the walking beam moves upwards each of the recesses 106*b* is disengaged from the circuit package which it has just moved to the right and moves upward and to the left and then downward again to engage the next succeeding circuit package for advancing it to the right. In this manner the walking beam 106 serves to march the circuit packages along the lower track section 126, the spring bar 127, the lower die track section 176 and the lower track section 128 in predetermined increments.

LEAD ALIGNMENT STATION

Figure 8:
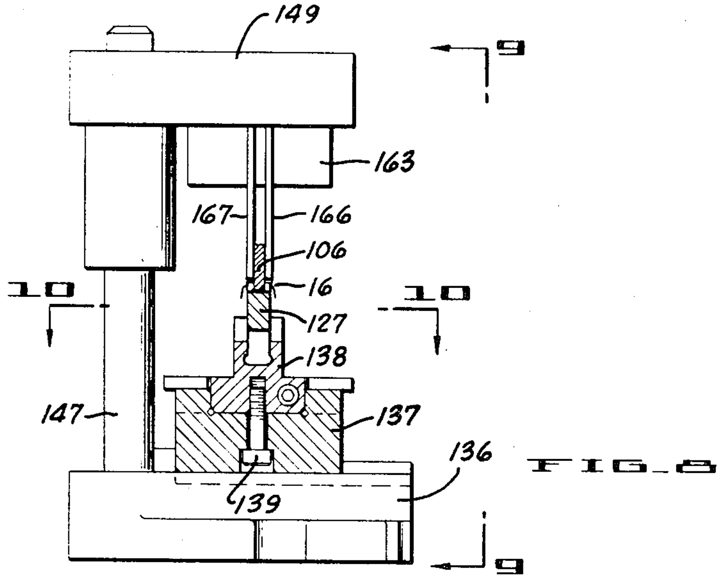
FIG. 8 is a side view partly in cross section of lead alignment apparatus.
Figures 9, 10:
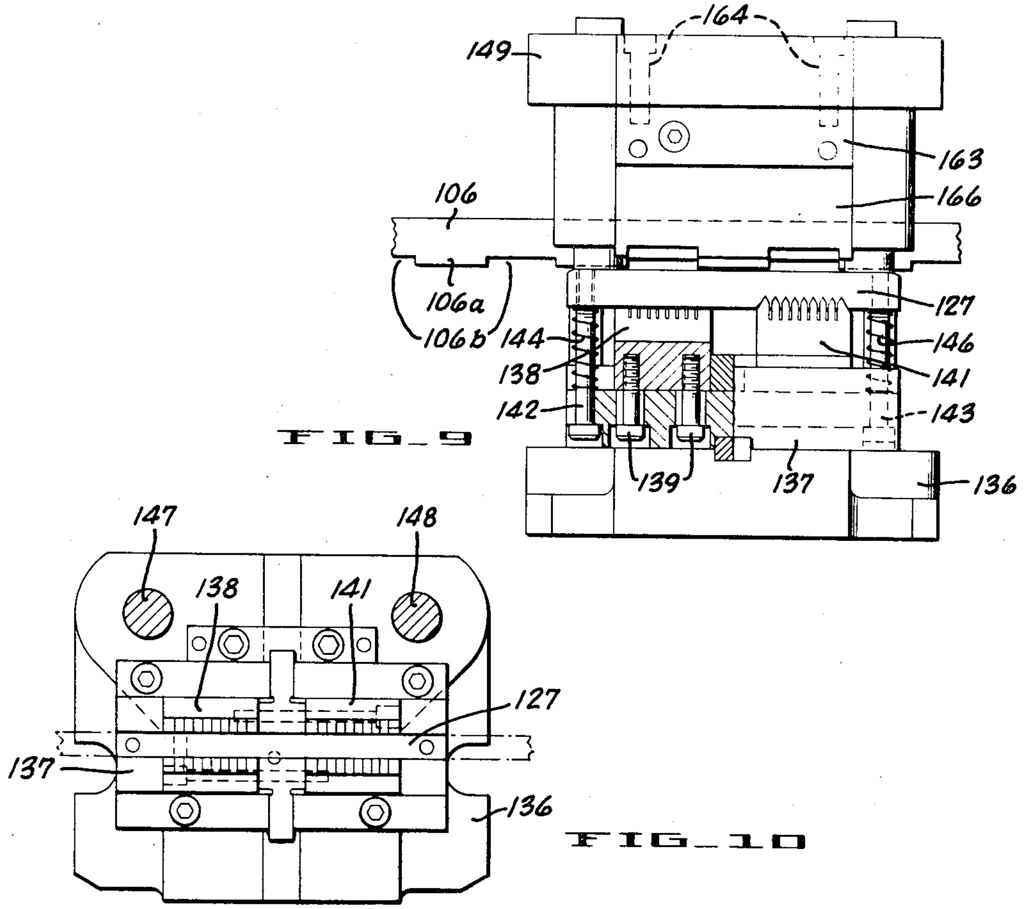
FIG. 9 is a front elevation of the lead alignment apparatus partly in cross section taken along the line 9—9 in FIG. 8.
FIG. 10 is a top plan view of the lead alignment apparatus taken along the line 10—10 in FIG. 8.

As the circuit packages are moved along the lower track section 126 by the walking beam 106 they move into a lead alignment station generally indicated by reference numeral 134. Details of the lead alignment station 134 are shown in FIG. 8 through 10. The lead alignment station 143 includes a bottom die 136 which is suitably mounted on the base 53. A bottom block 137 is mounted on the bottom die 136. The bottom block 137 has a comb 138 mounted thereto by suitable means such as screws 139. Similarly, the bottom block 137 has an additional comb 141 similarly mounted thereto. The bottom block 137 also has shoulder screws 142 and 143 mounted therein which extend upwardly and threadedly engage the spring bar 127. Springs 144 and 146 surround the shoulder screws 142 and 143, respectively, and extend between the spring bar 127 and bottom block 137 for springedly supporting the spring bar 127.

The bottom die 136 has two die posts 147 and 148 to which is mounted an upper die 149. Referring to FIG. 1, an air cylinder 151 has an operating shaft 152 which terminates in a flange 153 to which the upper die 149 is suitably secured by means such as screws 154. The air cylinder 151 is mounted on a frame assembly 156 which is secured to and supported by the base 53. The air cylinder 151 is connected through air lines 157 and 158 to a four-way air valve 159. The air valve 159 is connected by an air line 161 to a fitting 162. The fitting 162 is adapted to be connected to a source of air (not shown) for supplying air through the air line 161 to the four-way valve 159.

The upper die 149 has an upper block 163 secured thereto by suitable means such as screws 164 illustrated by phantom lines in FIG. 9. The upper block 163 mounts two upper die blades 166 and 167. The upper die blades 166 and 167 extend downwardly on either side of the walking beam 106.

Figure 11:
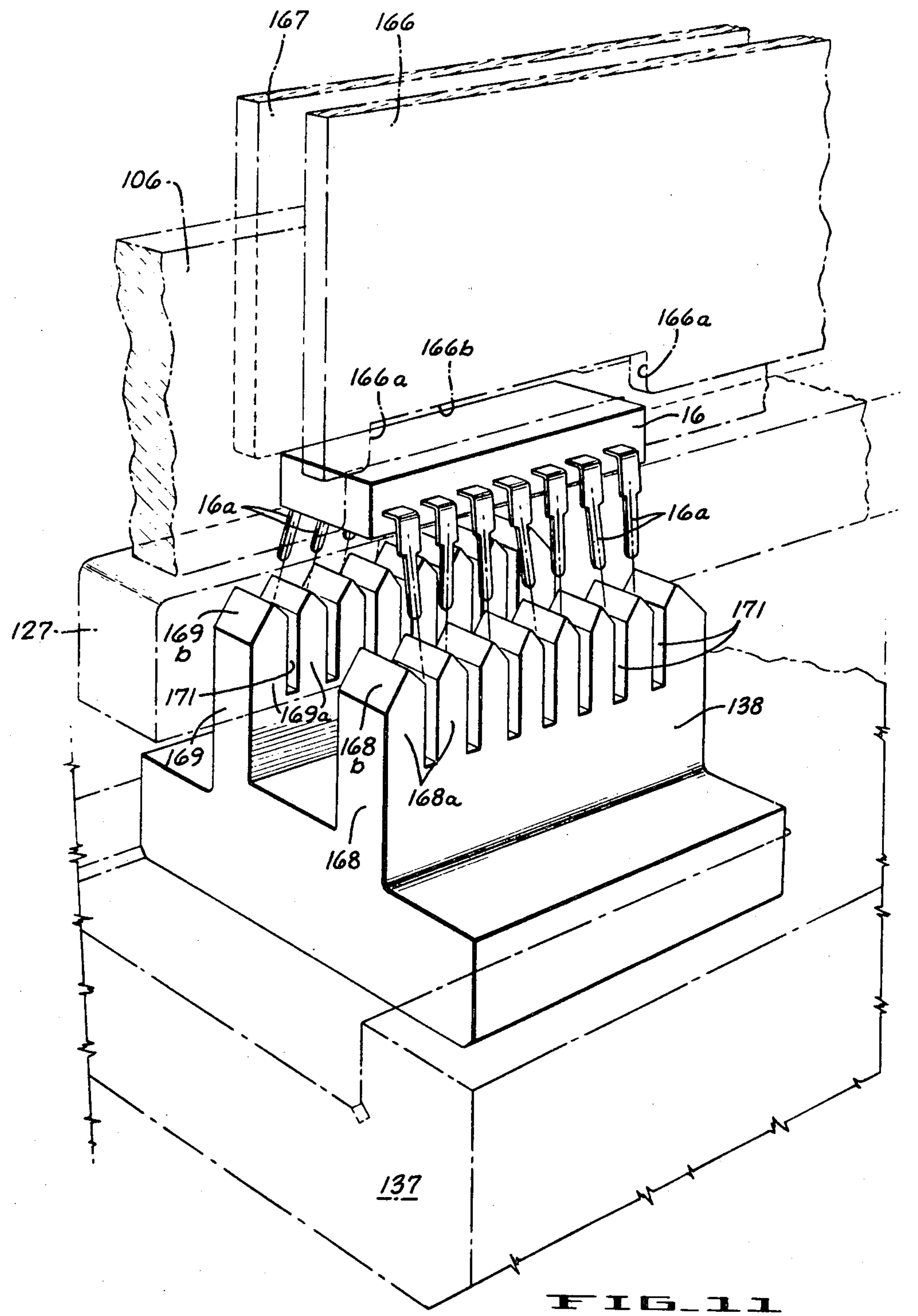
FIG. 11 is a perspective view of a comb with a circuit package about to be engaged therewith showing the out of alignment leads of the circuit package.

Operation of the lead alignment station 134 may best be understood by reference to FIGS. 11 through 16. FIG. 11 is a perspective view of a portion of the lead alignment station 134 showing the one comb 138 and an integrated circuit package 16 with structural details of the lead alignment station 134 being shown in phantom. As shown in FIG. 11, the circuit package 16 has a plurality of spaced downwardly depending leads 16*a* some or all of which may be out of alignment with each other as is apparent in FIG. 11. The spring bar 127 is generally continuous with the lower track section 126 and the walking beam 106 advances a circuit package 16 along the lower track section 126 in predetermined increments and onto the spring bar 127 in a predetermined position with respect to the comb 138. The comb 138 generally comprises a pair of spaced parallel members 168 and 169. The spaced parallel member 168 has a plurality of spaced generally parallel teeth 168*a* and the spaced parallel member 169 has a plurality of spaced generally parallel teeth 169*a*. The teeth 168*a* are parallel to and aligned with the teeth 169*a*. Both the teeth 168*a* and 169*a* define open-ended slots generally indicated by reference numerals 171 and the teeth 168*a* and 169a have inclined upper portions 168*b* and 169*b* which are inclined downwardly toward the slots 171.

As mentioned before, the walking beam 106 carries an integrated circuit package 16 to a predetermined position along the spring bar 127 with respect to the comb 138. Then the air cylinder 151 is actuated to cause the die blades 166 and 167 to move downward. The die blades 166 and 167 have shoulders 166*a* and 167*a*, respectively, forming a recesses generally indicated by reference numerals 166*b*, and 167*b*. As the die blades 166 and 167 move downwards the recesses 166*b* and 167*b* engage the circuit package 16 supported by the spring bar 127 in a predetermined position with respect to the comb 138 and force the circuit package downwardly against the spring biasing of the spring bar 127. As the circuit package 16 is forced downwardly the plurality of leads 16*a* of the circuit package 16 fall between the inclined upper portions 168*b* and 169*b* of the spaced parallel teeth 168*a* and 169*a*. As the circuit package 16, and hence the leads 16*a*, continue to be forced downward by the upper die blades 166 and 167 the inclined upper portions 168*b* and 169*b* guide the plurality of leads 16*a* downwardly into the open-ended slots 171. This causes a camming action in which any of the leads 16*a* out of alignment with the respective slots 171 are bent in one direction, that direction depending upon the horizontal orientation of the open-ended slots 171 with respect to the position of the circuit package 16 which is held by the die blades 166 and 167 in their recesses 166*b* and 167*b*.

Figures 12, 13, 14, 15, 16:
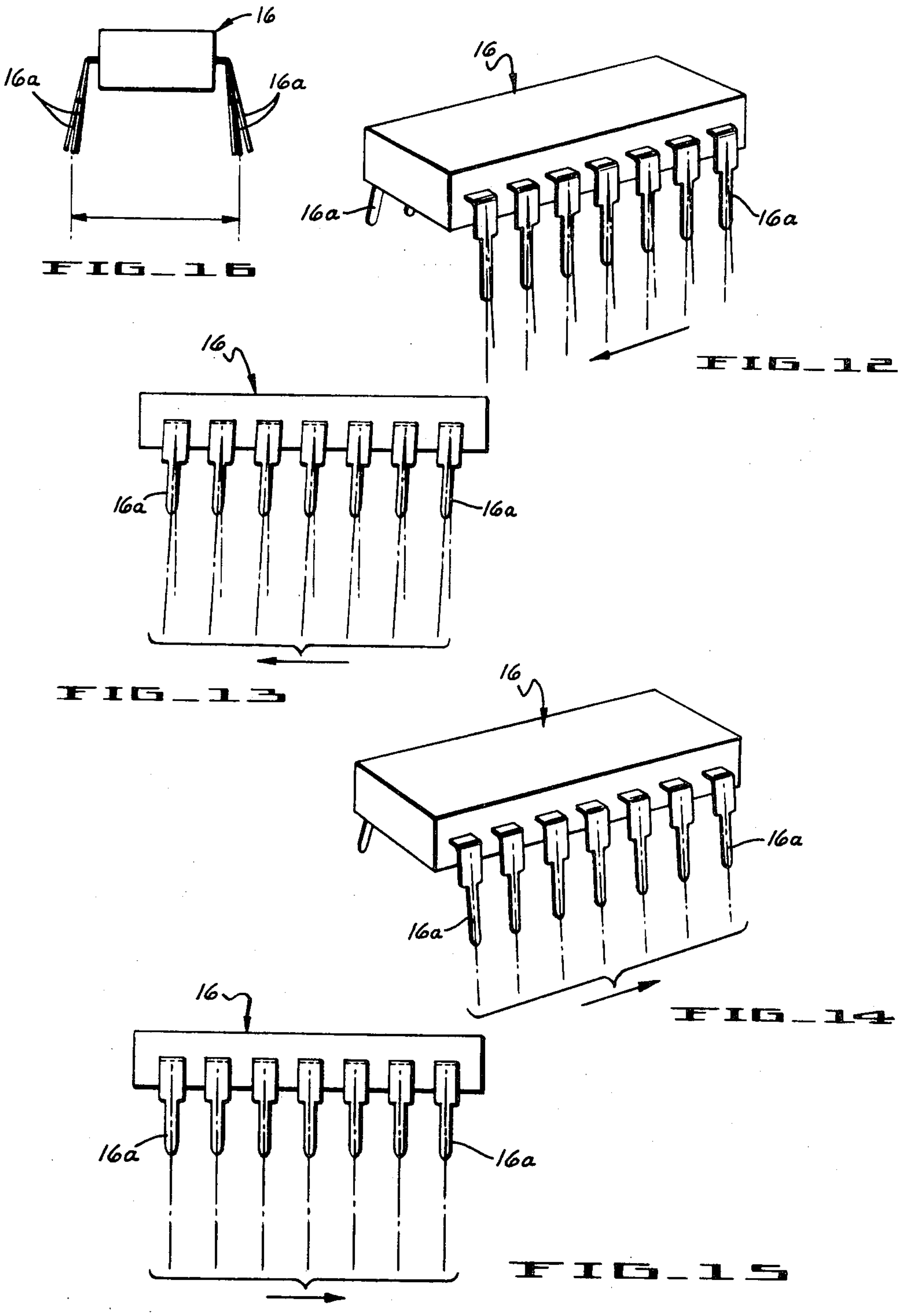
FIG. 12 is a perspective view of a circuit package after its leads out of alignment with a first orientation have been bent in a first direction.
FIG. 13 is a side elevation of the circuit package of FIG. 12.
FIG. 14 is a perspective view of a circuit package after its leads have been uniformly bent in a second direction so as to extend generally perpendicularly of the length of the circuit package.
FIG. 15 is a side elevation of the circuit package of FIG. 14.
FIG. 16 is an end view of the circuit package of FIG. 14.

Referring now to FIGS. 12 and 13 there is shown a circuit package 16 having a plurality of leads 16*a* and illustrating in accordance with a preferred embodiment of the invention the manner in which any of the leads 16*a* out of alignment with a desired orientation are bent uniformly in a first direction indicated by the arrows in FIGS. 12 and 13 to a first orientation with respect to the length of the circuit package 16. As can be seen in FIGS. 12 and 13, after the leads 16*a* of the circuit package have been inserted into engagement with the comb 138 and specifically into the open-ended slots 171 thereof the plurality of leads 16*a* are in alignment with each other but are displaced with respect to a direction perpendicular to the length of the circuit package. Next, the air cylinder 151 is actuated to operate its shaft 152 in a reverse direction so that the upper die blades 166 and 167 are withdrawn from contact with the circuit package 16. Spring biasing force on the spring bar 127 pushes the circuit package 16 upward so as to withdraw its lead 16*a* from the open-ended slots 171 in the comb 138. The walking beam 106 then with its next cycle moves the circuit package 16 along the spring bar 127 to position the circuit package in a second predetermined position with respect to an additional comb 141. The air cylinder 151 is then actuated to again reverse tis direction so that the die blades 166 and 167 again engage the circuit package 16 and force it against the spring biasing force applied to the spring bar 127 downwardly into engagement with the additional comb 141. Comb 141 is similar to the comb 138 so that it is believed no additional details of the additional comb 141 need be described. The comb 141 is positioned with respect to the circuit package positioned so that as the upper die blades 166 and 167 force the circuit package 16 downwardly the leads 16a are engaged by upper inclined portions of teeth in the comb 141 and guided into narrow slots between the teeth in the comb 41. The narrow slots in the comb 141 are positioned such that the leads 16*a* of the circuit package are bent in a second direction opposite to the first direction in which the leads were bent by the one comb 138. After the leads are bent by the second comb 141 they appear in a configuration such as shown in FIGS. 14 and 15 in which the leads are in alignment with each other and all generally depend perpendicularly with respect to the length of the circuit package 16. Actually, in adjusting the position of the combs 138 and 141 it is necessary to position the slots formed by the teeth of the combs 138 and 141 a little bit further than the intended final orientation of the leads in order to bend the leads past their yield point at the desired orientation and allow for springback. The springback property of the leads is also the reason for first ensuring that all the leads are bent in a first direction and then bending all the leads in a second opposite to the first direction just past the intended final center lines of the leads so that when the leads spring back they will be on their intended center lines. As shown in FIG. 11, initially the leads 16*a* of the circuit package may be skewed to either direction of perpendicular with respect to the length of the circuit package. If it were attempted to align all the leads so that they are perpendicular with respect to the circuit package with one comb operation, the leads might spring back after being withdrawn from the comb. Displacing the comb just past the intended center line in a single operation would not suffice because the leads might be originally skewed to either or both direction with respect to perpendicular so that displacing the comb in only one direction would not suffice. However, by performing two operations on the leads in which in a first operation those leads out of alignment with a first orientation are displaced in a first direction to that orientation and in which in a second subsequent operation all the leads are bent in a second direction opposite to the first direction just past their intended final center lines, when the leads spring back they will be on their intended center lines. The resulting lead orientation after spring back of the leads is that all the leads are aligned with respect to each other and all generally depend perpendicularly with respect to each other and all generally depend the circuit package.

After being processed through the two combs 138 and 141 of the lead alignment apparatus 134, the leads 16*a* of a circuit package 16 are aligned with respect to each other along the length of the circuit package and all generally depend perpendicularly with respect to the length. However, the leads 16*a* may and probably will be skewed with respect to an intended final angle with respect to the width *w* of the circuit package as shown in FIG. 16.

RESTRIKE STATION

In order to align the leads 16*a* of a circuit package 16 along an intended angle with respect to the width of the circuit package 16, a restrike station 172 is disposed adjacent the lead alignment station 134. Restrike means comprising the restrike station 172 is shown in detail in FIGS. 17, 18 and 19.

The restrike station 172 includes a support 173 which is suitably secured such as by screws 174 to the base 53. A bottom member 175 is mounted on the support 173 by suitable means such as bracket 177 and screws 178. The bottom member 175 mounts a bottom die track section 176 having oppositely disposed forming surfaces 176*a*. The bottom member 175 has grooves 179 on either side of the bottom die track section 176 in which cam rollers 181 and 182 are disposed. The cam roller 181 has a roller shaft 183 mounted in a restrike slide die 184. Similarly, the cam roller 182 has a roller shaft 186 mounted in a restrike slide die 187. The restrike slide dies 184 and 187 have die surfaces 184*a* and 187*a*, respectively. A pair of shoulder screws 188 extend through a bracket 189 and through an upstanding portion 175*a* of the bottom member 175 and threadly engage the restrike slide die 184. Springs 191 surround a portion of the shoulder screws 188 and abut against the upstanding portion 175*a* to spring bias the restrike slide die 184 outwardly away from the bottom die track section 176. In a similar manner a pair of shoulder screws 192 extend through a bracket 193 and the upstanding portion 175*a* of the bottom member 175 threadedly engage the restrike slide die 187. Springs 194 surround a portion of the shoulder screws 192 and abut against eh upstanding portion 175*a* to spring bias the restrike slide die 187 outwardly away from the bottom die track section 176.

Figure 17:
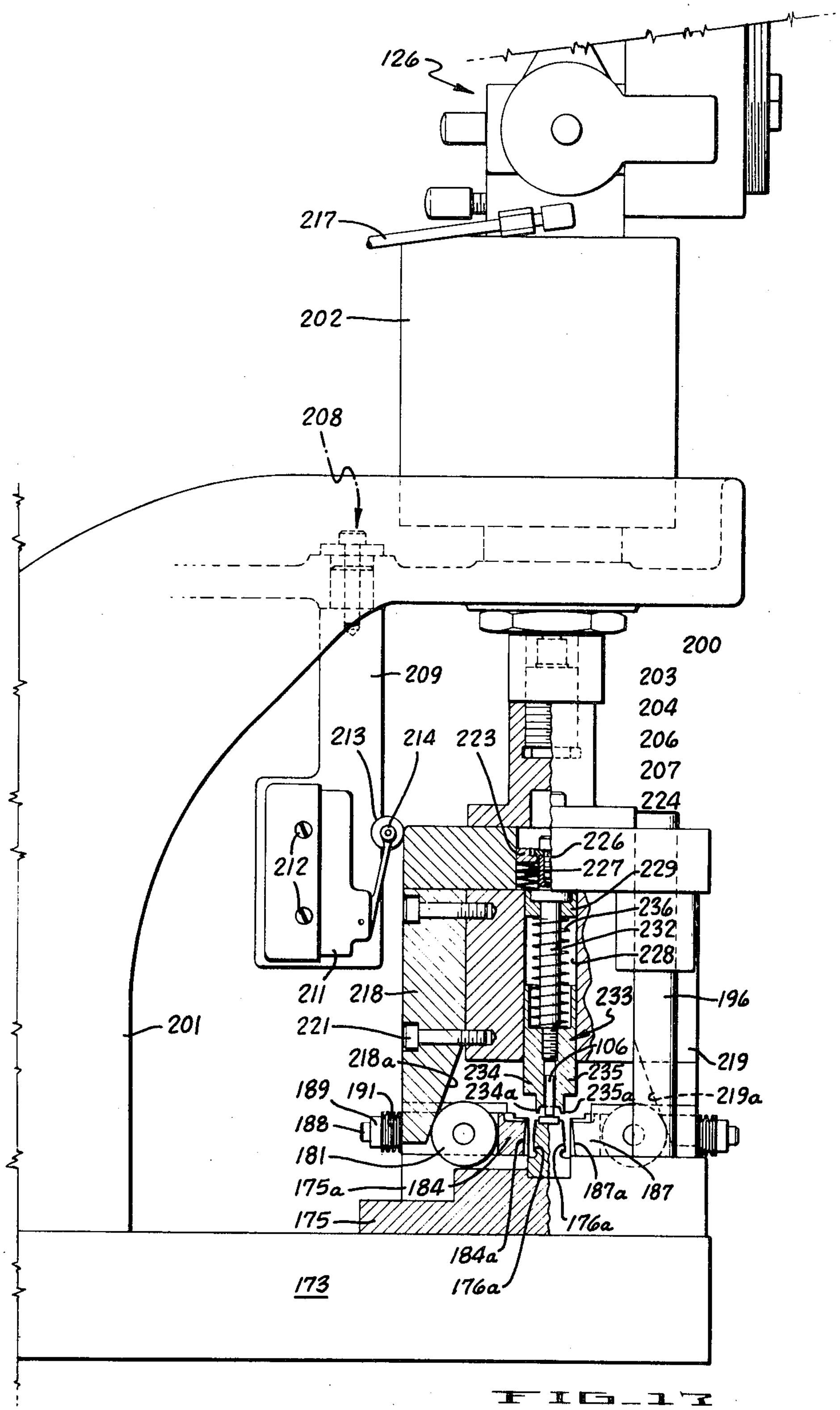
FIG. 17 is a side view partly in cross section of a restrike apparatus.
Figures 18, 19:
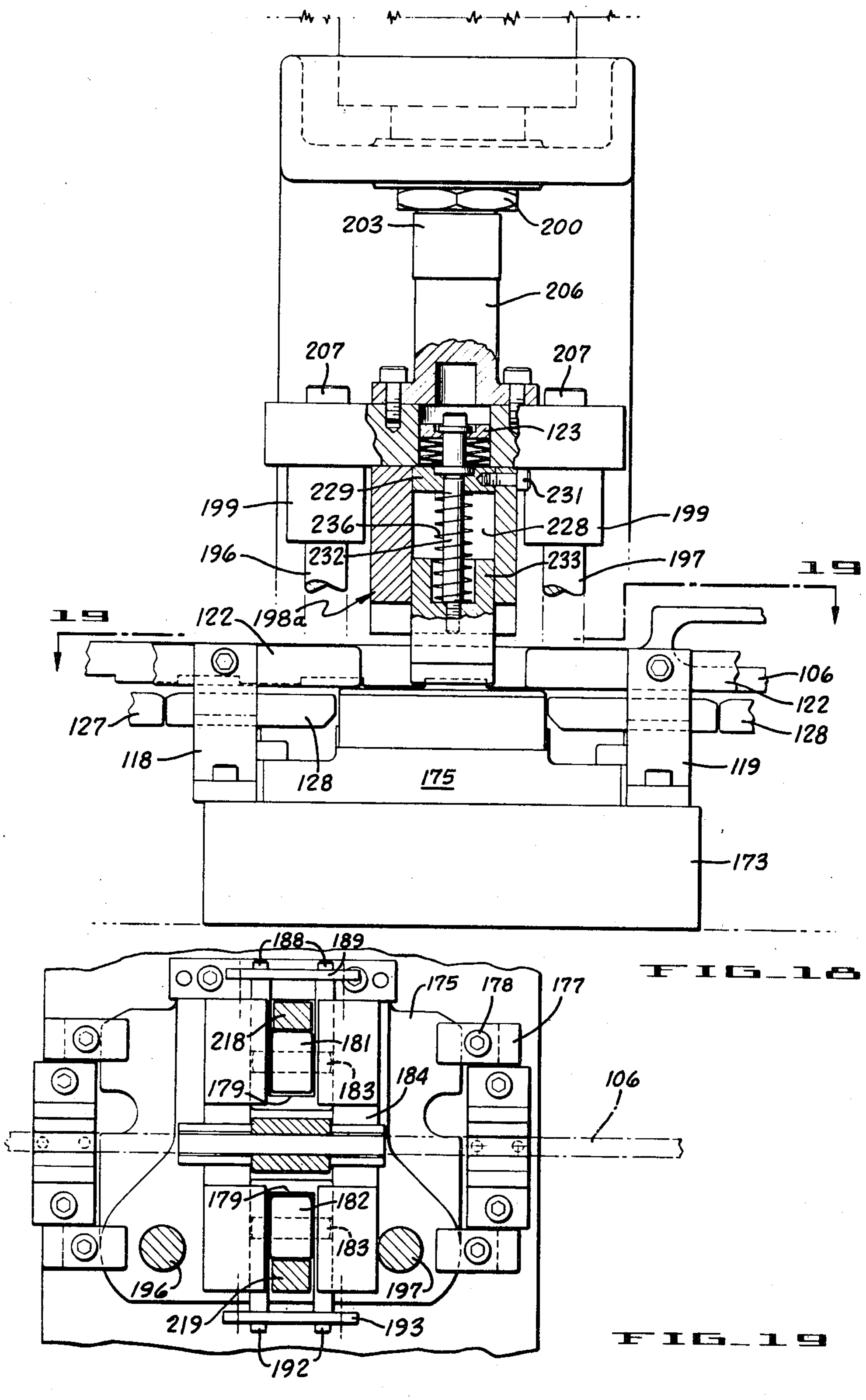
FIG. 18 is a front view partly in cross section of the restrike apparatus of FIG. 17.
FIG. 19 is a sectional view of the restrike apparatus of FIG. 18 taken along the line 19—19.
Figure 20:
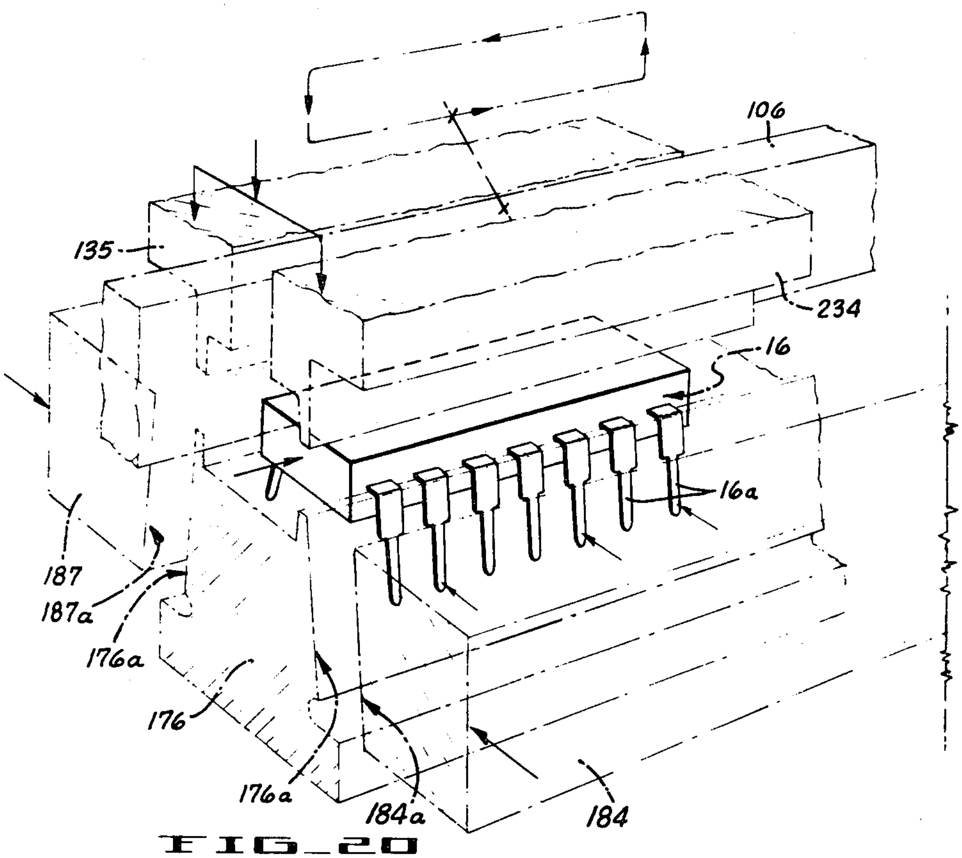
FIG. 20 is a perspective view of the restrike station showing a circuit package in position with the restrike apparatus in phantom lines.

The bottom member 175 also mounts a pair of upwardly extending die posts 196 and 197. An upper die support member 198 having bushings 199 is slidably mounted on the die posts 196 and 197. The support 173 as shown in FIG. 17 suitably mounts an upwardly extending arm 201 to which is mounted an air cylinder 202 by a retaining nut 200. The air cylinder 202 has an operating shaft 203 terminating in a threaded coupling 204 which threadedly engages a flange 206. The flange 206 is suitably attached such as by screws 207 to the upper die support member 198. The upwardly extending arm 201 suitably mounts such as by screw assembly 208 a downwardly extending switch bracket 209 to which a switch 211 is mounted by screws 212. The switch 211 has a roller arm 213 which mounts a roller 214 adapted to engage the upper die support member 198.

The air cylinder 202 has mounted thereto as shown in FIG. 17 a four-way air valve assembly 216. The air valve assembly includes connections to the air cylinder and an input air line 217. The input air line is adapted to be connected to a source of air (not shown).

The upper die support member 198 has a downwardly depending central portion 198*a*. Cam blocks 218 and 219 having inclined cam surfaces 218*a* and 219*a*, respectively, are mounted by suitable means such as screws 221 to the downwardly depending central portion 198*a*. The upper die support member 198 has a central opening generally indicated by reference numeral 222 in which is fixedly mounted a screw guide stop 223. A screw 224 threadedly engages a centering member 226, the screw 224 and centering member 226 both extending through the screw guide stop 223. A spring 227 surrounds a portion of the centering member 226. The downwardly depending central portion 198*a* of the upper die support member 198 also has a central opening, generally indicated by reference numeral 228. A screw guide stop 229 is suitably fixedly mounted in the central opening 228 by means such as screw 231. The centering member 226 extends slidably through the screw guide stop 229 and threadedly engages a clamping die 233 which is adapted for slidable movement within the central opening 228 of the downwardly depending central portion 198*a* of the upper die support member 198. The clamping die 233 includes a pair of extended members 234 and 235 disposed on either side of the walking beam 106 and terminating in clamping portions 234*a* and 235*a*. A spring 236 is disposed about the centering member 226 between the screw guide stop 229 and the clamping die 233.

The operation of the restrike station 172 may best be understood by consideration of FIGS. 17 through 22. The walking beam 106 advances a circuit package 16 to the restrike station 172 and deposits the circuit package on support means comprising the bottom die track section 176. The circuit package leads 16*a* extend out over the forming surfaces 176*a* of the bottom die track section 176 while retained thereon. As air is supplied to the air cylinder 202 from the input air line 217 by the input air valve assembly 216, the air cylinder 202 is actuated so that its operating shaft 203 moves downward. Downward movement of the operating shaft 203 causes downward movement of the upper die support member 198 and its downwardly depending central portion 198*a* as well as the cam blocks 218 and 219.

As the downwardly depending central portion 198*a* moves downwardly the clamping die 233 and the centering member 226 which threadedly engages the clamping die 233 also move downward. Downward travel of the clamping die 233 continues until the clamping portion 234*a* and 235*a* of its extended members 234 and 235 engage the top of the circuit package leads 16*a* immediately adjacent the circuit package 16.

As the upper die support member 198 and its downwardly depending central portion 198*a* continue to move downward the clamping die 233 remains stationary with the downwardly depending central portion 198*a* sliding down the stationary clamping die 233. As the downwardly depending central portion 198*a* slides with respect to the clamping die 233, the shoulder screw 232 which threadedly engages the clamping die 233 tends to move upwards with respect to the upper die support member 198 against the spring biasing force of the spring 227.

As the spring 227 compresses it develops a strong clamping force which is transmitted through the centering member 226 to the clamping die 233. The air cylinder 202 continues to be supplied with air from the input air line 217 to move its operating shaft 203 downwards until a predetermined air pressure is developed within the aircylinder 202 which may be sensed, for example, by a pressure switch (not shown) connected to the input air line 217. This predetermined air pressure corresponds to a predetermined clamping force exerted by the clamping portions 234*a* and 235*a* of the extended members 234 and 235 of the clamping die 233 on the top of the leads 16*a* of a circuit package 16.

Figure 21:
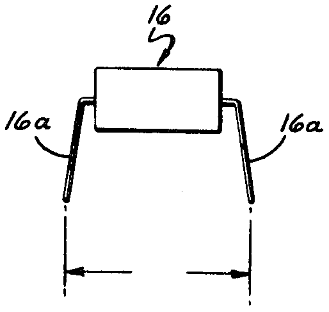
FIG. 21 is an end view of a circuit package after its leads have been bent by the restrike apparatus.

While the upper die support member 198 and its downwardly depending central portion 198*a* have been moving downward, the cam blocks 218 and 219 have also been moving downward. As the cam blocks 218 and 219 move downward the cam rollers 181 and 182 follow the inclined cam surfaces 218*a* and 219*a*, carrying the restrike slide dies 184 and 187 inwards against the biasing forces of springs 191 and 194 towards the bottom die track section 176. Continued movement of the restrike slide dies 184 and 187 catches the leads 16*a* of circuit package 16 between the die surfaces 184*a* and 187*a* and the forming surfaces 176*a* of the bottom die track station 176. This bends any of the leads which generally are out of alignment with the inclined forming surfaces 176*a* to the shape of those forming surfaces with respect to the width of a circuit package 16. Actually, the forming surfaces 176 *a* are inclined somewhat more than the intended final orientation of the leads 16*a* in order to allow for spring back thereof. Thus the restrike station aligns the leads 16*a* with respect to the width of the circuit package so that as shown in FIG. 21 the leads 16*a* are aligned with each other along the width of the circuit package 16 and the two opposite rows of leads 16*a* depend downwardly at a desired angle with respect to the width of the package and terminate a desired distance *w* apart.

Figure 22:
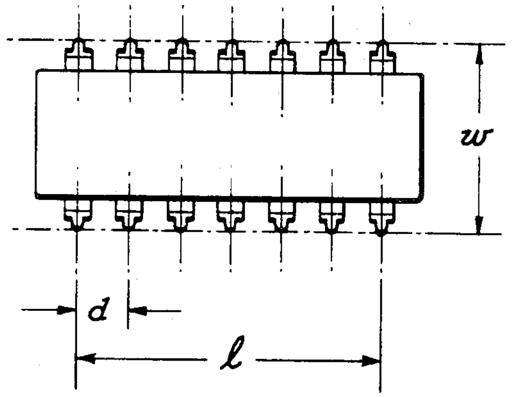
FIG. 22 is a top plan view of the circuit package of FIG. 21.
Figure 23:
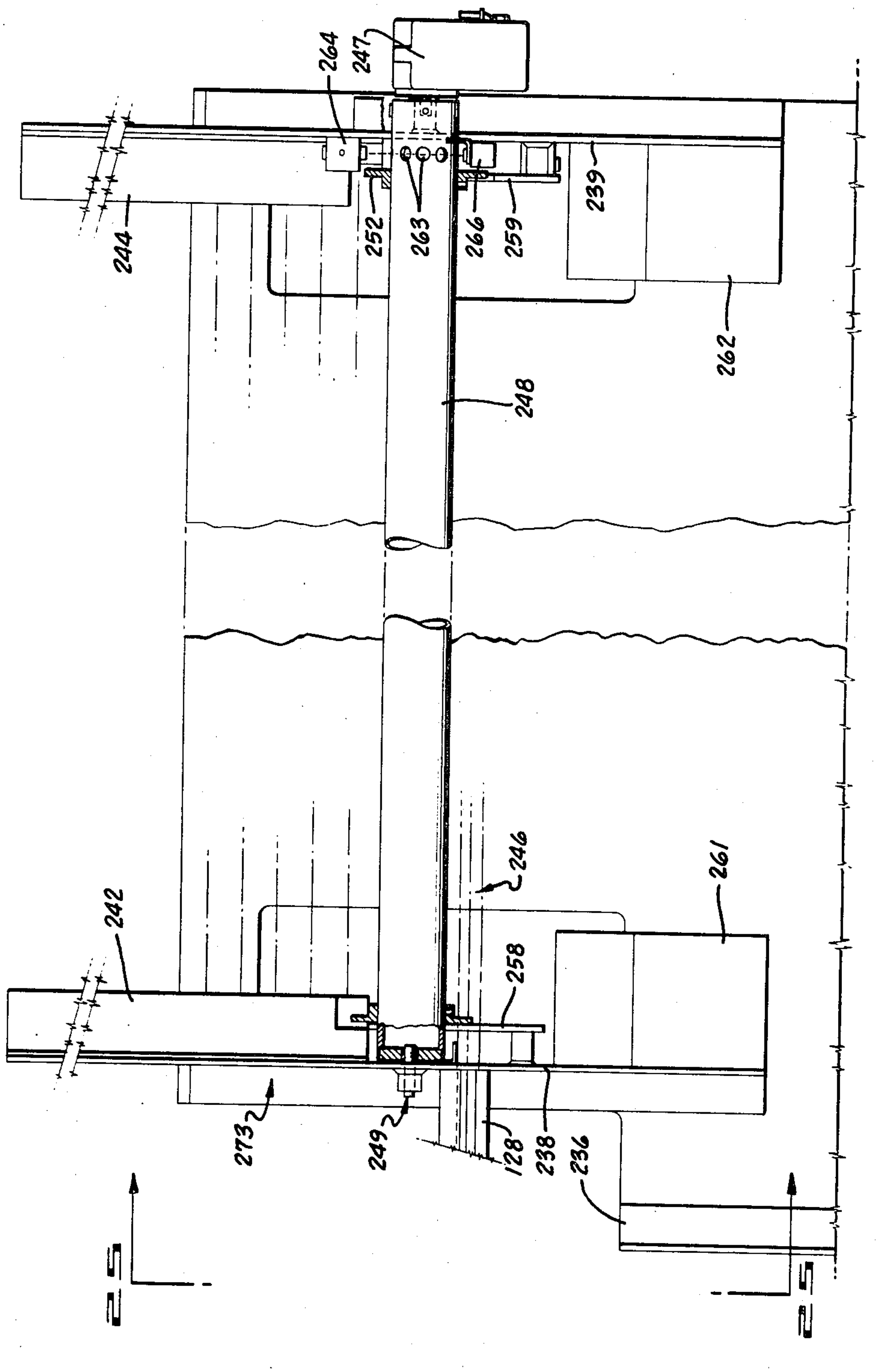
FIG. 23 is a front elevation of tube loading apparatus.
Figures 24, 25, 26:
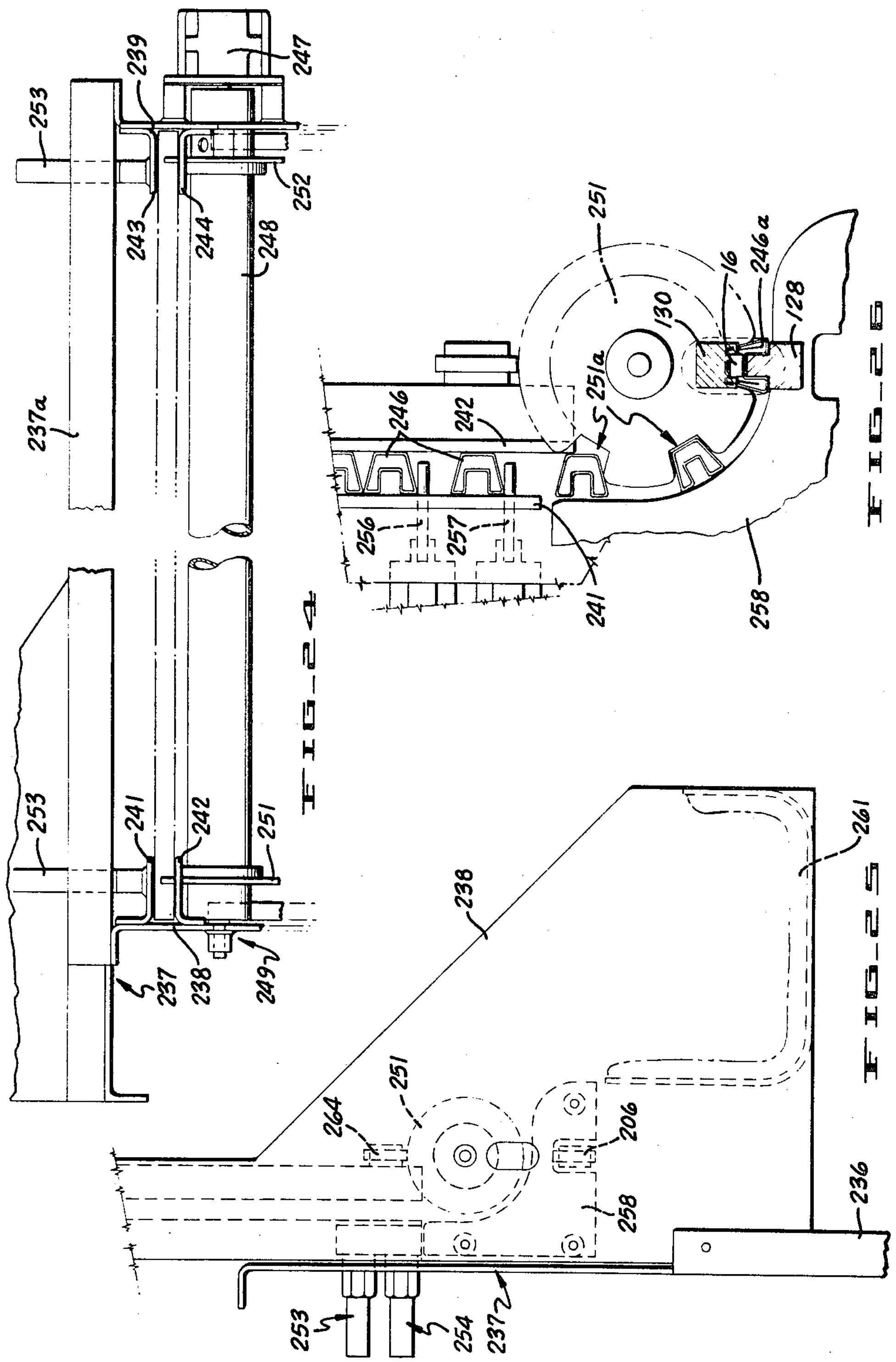
FIG. 24 is a front elevation of the tube indexing portion of the tube loading apparatus.
FIG. 25 is a side elevation of the indexing portion of the tube loading apparatus.
FIG. 26 is a detail partly in cross section showing a portion of the tube indexing apparatus and illustrating the manner of tube indexing.

A circuit package 16 as it appears after processing through the lead alignment station and the restrike station is shown in FIG. 22. The two rows of leads 16*a* are aligned with respect to the width of the circuit package and terminate a desired distance *w* apart, the individual leads in each row are spaced a desired uniform distance *d* apart along the length of circuit package 16 and the leads depend down generally perpendicularly with respect to the length of the circuit package so that there is a desired overall lead spacing 1.

TUBE LOADING APPARATUS

Details of tube loading means for loading circuit packages into shipping tubes are shown in FIGS. 23 through 26. The track output end 125 comprises a lower track section 128 and an upper track section 130 which cooperate to form the track slot 28. Tube loading means is situated adjacent the track output end 125.

The tube loading means comprises a support 236 for supporting a frame assembly 237. The frame assembly 237 includes a back portion 237*a*. Two end covers 238 and 239 are mounted to the frame assembly 237. Two vertically extending guide members 241 and 242 are mounted to the end cover 238 and form a generally U-shaped channel therebetween. Similarly, two vertically extending guide members 243 and 244 are mounted to the end cover 239 and form a generally U-shaped channel therebetween. The U-shaped channels formed by the guide members 241, 242, 243 and 244 are adapted to receive a plurality of shipping tubes 246 in side by side relationship. Each of the shipping tubes 246 can be formed of a translucent plastic and have the general cross-sectional configuration illustrated in FIG. 26. The end cover 239 mounts an indexing means in the form of a motor 247. The motor 247 has an extended shaft 248 which is supported in a bushing assembly 249 on the end cover 238. The extended shaft 248 has two spaced gear members 251 and 252. The spaced gear members 251 and 252 each have a plurality of recesses 251*a* and 252*a*, respectively. The recesses 251*a* and 252*a* are adapted to engage the shipping tubes 246. The frame assembly 237 mounts two pairs of air cylinders 253 and 254 which have two pairs of respective operating stop shafts 256 and 257. The operating stop shafts 256 and 257 are adapted to extend between adjacent shipping tubes 246 in a manner discussed hereinafter. A curved guide memeber 258 is suitablely mounted to end cover 238 and an identical curved guide member 259 is mounted to the end cover 239. Catching pans 261 and 262 are respectively mounted to the end covers 238 and 239. The shaft 248 has a plurality of openings 263 adjacent the end cover 239. Detecting means is provided for detecting when the one of the shipping tubes 246 which is being filled is full of circuit packages. This detecting means comprises a light source 264 adapted to direct light through the openings 263 and through the one of the shipping tubes 246*a* which is being filled with circuit packages and onto a photoelectric detector 266.

In operation a plurality of shipping tubes 246 are stacked side by side and retained in the U-shaped channels formed by vertically extending guide members 241, 242, 243 and 244. The two pairs of air cylinders 253 and 254 function as an escapement for feeding one of the shipping tubes at a time to spaced gear members 251 and 252 which capture the shipping tubes 246 in their recesses 251*a* and 252*a*. The shipping tubes 246 are held in the recesses 251*a* and 252*a* as the spaced gear members 251 and 252 rotate by the curved guide members 258 and 259. The spaced gear members 251 and 252 rotate picking up shipping tubes 246 released by the operating stop shafts 257, until one of the shipping tubes (246*a* in FIG. 26) is rotated to a position where it is in alignment with the track output end 125 comprising lower track section 128 and upper track section 130. Movement of the walking beam 106 pushes circuit packages 16 out of the track output end 125 and into the shipping tube 246*a*. Circuit packages push each other in end-to-end relationship along the length of the shipping tube 246*a* until it is filled. When it is filled circuit packages extend all the way to the end of the tube 246*a* adjacent gear member 252 so that the light from the light source 264 is obstructed by circuit packages so that it does not strike the photoelectric detector 266. The photoelectric detector 266 senses this absence of light and actuates the motor 247 to rotate whereby the spaced gear members 251 and 252 rotate. As the spaced gear memebers 251 and 252 rotate the shipping tube which has just been filled with circuit packages falls along the curved guide members 258 and 259 and into the catching pans 261 and 262 and another shipping tube 246 is aligned with the track output end 125 comprising upper and lower track sections 130 and 128. This shipping tube then fills with circuit packages and falls into the catching pans 261 and 262 as another empty shipping tube is brought into position and so on.

Thus what has been described is an improved method and apparatus for aligning the leads of a circuit package with respect to each other and with respect to the length of the circuit package, and also aligning the leads with respect to the width of the circuit package. Further, automatic feeding and loading apparatus has been described for automatically batch processing a plurality of circuit packages through alignment apparatus.

I claim:

1. A method for aligning leads of integrated circuit packages of the type having a plurality of leads spaced along the length of the circuit package and extending from both sides of the circuit package generally in a perpendicular direction with respect to the length of the circuit package and in an angular direction with respect to the width of the circuit package comprising bending any of the leads which are out of alignment with a first lead orientation in a first direction parallel to the length of the circuit package so that the leads are all parallel to each other and all have the first lead orientation, bending all of the leads in a second direction parallel to the length of the circuit package and opposite to the first direction so that all of the leads remain in alignment with each other and all of the leads further have a second orientation whereby they extend generally perpendicularly of the length of the circuit package, bending any of the leads which are out of alignment with a desired angular orientation with respect to the width of the circuit package in a direction parallel to the width of the circuit package whereby all of the leads extend generally perpendicularly of the length of the circuit package and all have the desired angular orientation with respect to the width of the circuit package.

2. A method in accordance with claim 1 including automatically feeding the circuit packages from a magazine prior to any bending operations and automatically feeding the circuit packages into shipping tubes after all bending has been performed.

3. Lead alignment apparatus for aligning leads of integrated circuit packages of the type having a plurality of leads spaced along the length of the circuit package and extending from both sides of the circuit package generally in a perpendicular direction with respect to the length of the circuit package comprising means forming a track having an input end and an output end, lead alignment means forming a lead alignment station disposed along said track intermediate said input and output ends, said lead alignment means including at least one comb having a pair of spaced parallel members, said members having a plurality of spaced generally parallel teeth in which the teeth in one member are in alignment with the teeth in the other member, said teeth having open-ended slots between the same, said teeth having inclined upper portions which are inclined downwardly toward the slots, transport means for transporting circuit packages along said track through said lead alignment station, means for engaging a circuit package in said lead straightening station with said comb whereby any of the plurality of leads of the circuit package which are out of alignment engage the inclined portions of said plurality of teeth and are guided into said slots to align the same.

4. Lead alignment apparatus as in claim 3 including an additional comb in said lead alignment station, said additional comb having a pair of spaced parallel members, said members having a plurality of spaced generally parallel teeth in which the teeth in one member are in alignment with the teeth in the other member, said teeth having open-ended slots between the same, said teeth having inclined upper portions which are inclined downwardly toward the slots, means for engaging a circuit package in said lead straightening station with said additional comb whereby after any of the leads out of alignment are bent in a first direction by said first comb all of the leads are bent in a second direction opposite to said first direction by said second comb so that the leads are aligned with respect to each other and extend generally perpendicularly with respect to the length of the circuit package.

5. Lead alignment apparatus in accordance with claim 3 including restrike means forming a restrike station disposed along said track intermediate said track input and output ends, said restrike means including support means having at least two spaced forming surfaces, at least two forming members respectively spaced with respect to said forming surfaces, said support means adapted to support a circuit package with the leads of both sides of the circuit package extending respectively between said forming surfaces and said forming members, means for causing relative movement between said forming surfaces and said forming members whereby the plurality of leads are bent generally to the shape of said forming surfaces with respect to the width of the circuit package.

6. Lead alignment apparatus in accordance with claim 5 including clamping means for clamping a circuit package in said restrike station to said support means.

7. Lead alignment apparatus as in claim 3 wherein said transport means comprises a walking beam having recesses adapted to engage circuit packages for transporting the circuit packages along said track.

8. Lead alignment apparatus as in claim 3 including a magazine feed connected to said track input for automatically feeding circuit packages to said track.

9. Lead alignment apparatus as in claim 8 wherein said magazine feed comprises a frame for mounting a magazine, said frame having a portion thereof defining a guide opening in alignment with said track input end, said magazine including at least one tube for retaining a plurality of circuit packages in end-to-end relationship, said tube having an open end adapted to be aligned with said guide opening.

10. Lead alignment apparatus as in claim 9 wherein said magazine includes a plurality of tubes each adapted to retain a plurality of circuit packages in end-to-end relationship, indexing means for sequentially aligning each of said tubes open ends with said guide opening, and detecting means responsive to the absence of circuit packages in a tube aligned with said guide opening for controlling said indexing means to align another of said tubes with said guide opening.

11. Lead alignment apparatus as in claim 9 wherein said track includes escapement means adjacent said track input end for feeding circuit packages one at a time to said transport means.

12. Lead alignment apparatus as in claim 3 including tube loading means connected to said track output end for automatically loading circuit packages from said track, said tube loading means including at least one tube for supporting circuit packages in end-to-end relation and loading means for loading circuit packages from said track into said tube.

13. Lead straightening apparatus as in claim 9 wherein said tube loading means comprises a plurality of tubes each having an open end, a frame for supporting said plurality of tubes, indexing means for sequentially aligning each of said tubes open ends with said track output, and detecting means responsive to filling of said tubes with circuit packages for controlling said indexing means.

* * * * *